US009373480B2

(12) United States Patent
Kawanishi et al.

(10) Patent No.: US 9,373,480 B2
(45) Date of Patent: Jun. 21, 2016

(54) CHARGED PARTICLE BEAM DEVICE AND FILTER MEMBER

(71) Applicant: Hitachi High-Technologies Corporation, Minato-ku, Tokyo (JP)

(72) Inventors: Shinsuke Kawanishi, Tokyo (JP); Yusuke Ominami, Tokyo (JP); Masahiko Ajima, Tokyo (JP); Hiroyuki Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/782,695

(22) PCT Filed: Mar. 5, 2014

(86) PCT No.: PCT/JP2014/055538
§ 371 (c)(1),
(2) Date: Oct. 6, 2015

(87) PCT Pub. No.: WO2014/167919
PCT Pub. Date: Oct. 16, 2014

(65) Prior Publication Data

US 2016/0071685 A1 Mar. 10, 2016

(30) Foreign Application Priority Data

Apr. 12, 2013 (JP) ................................ 2013-083458

(51) Int. Cl.
*H01J 37/16* (2006.01)
*H01J 37/18* (2006.01)
(Continued)

(52) U.S. Cl.
CPC ............... *H01J 37/16* (2013.01); *H01J 37/026* (2013.01); *H01J 37/18* (2013.01); *H01J 37/20* (2013.01);
(Continued)

(58) Field of Classification Search
CPC .......... H01J 37/16; H01J 37/18; H01J 37/20; H01J 37/026; H01J 2237/2003; H01J 2237/2004
See application file for complete search history.

(56) References Cited

U.S. PATENT DOCUMENTS

2007/0045559 A1* 3/2007 Chao ...................... H01J 37/20 250/441.11
2007/0145268 A1* 6/2007 Chao ...................... H01J 37/20 250/310
(Continued)

FOREIGN PATENT DOCUMENTS

JP 2000-133186 A 5/2000
JP 2006-147430 A 6/2006
(Continued)

OTHER PUBLICATIONS

International Search Report (PCT/ISA/210) issued in PCT Application No. PCT/JP2014/055538 dated Apr. 8, 2014 with English translation (six pages).

*Primary Examiner* — Nicole Ippolito
*Assistant Examiner* — Sean Luck
(74) *Attorney, Agent, or Firm* — Crowell & Moring LLP

(57) ABSTRACT

In a SEM device which enables observations under an atmospheric pressure, in the event that a diaphragm is damaged during an observation of a sample, air flows into a charged particle optical barrel from the vicinity of the sample, due to the differential pressure between the inside of the charged particle optical barrel under vacuum and the vicinity of the sample under the atmospheric pressure. At this time, the sample may be sucked into the charged particle optical barrel. In this case, a charged particle optical system and a detector are contaminated thereby, which causes performance degradation or failures of the charged particle microscope. For coping therewith, it is necessary to prevent the charged particle optical barrel from being contaminated, without inducing a time lag, with a simple structure. In a charged particle beam device adapted to place a sample in a non-vacuum environment, there is provided a filter member which is placed on the path of a primary charged particle beam at least in a state where the primary charged particle beam is directed to the sample and, further, is adapted to transmit or pass, therethrough, the primary charged particle beam and secondary charged particles derived from the sample, while intercepting at least a portion of a scattering substance which is scattered in the event of a fracture of the diaphragm.

11 Claims, 12 Drawing Sheets

(51) Int. Cl.
*H01J 37/20* (2006.01)
*H01J 37/02* (2006.01)
*H01J 37/26* (2006.01)

(52) U.S. Cl.
CPC ........... *H01J 37/26* (2013.01); *H01J 2237/022* (2013.01); *H01J 2237/0213* (2013.01); *H01J 2237/2003* (2013.01); *H01J 2237/2006* (2013.01)

(56) References Cited

U.S. PATENT DOCUMENTS

| | | | | |
|---|---|---|---|---|
| 2008/0135778 | A1* | 6/2008 | Liu ......................... | H01J 37/20 250/440.11 |
| 2009/0242762 | A1 | 10/2009 | Nishiyama et al. | |
| 2009/0242763 | A1* | 10/2009 | Buijsse ................. | H01J 37/023 250/307 |
| 2010/0051803 | A1 | 3/2010 | Koizumi et al. | |
| 2010/0171037 | A1* | 7/2010 | Bierhoff .................. | H01J 37/16 250/310 |
| 2010/0224780 | A1* | 9/2010 | Spruck ............... | G02B 21/0004 250/309 |
| 2011/0031394 | A1* | 2/2011 | Knowles ............... | H01J 37/301 250/307 |
| 2011/0079710 | A1* | 4/2011 | Damiano, Jr. ........... | H01J 37/20 250/307 |
| 2011/0303845 | A1* | 12/2011 | Yaguchi .................. | H01J 37/20 250/310 |
| 2012/0025103 | A1* | 2/2012 | Deshmukh ......... | G01N 21/0303 250/491.1 |
| 2012/0298883 | A1* | 11/2012 | Grogan ................... | H01J 37/20 250/440.11 |
| 2014/0246583 | A1 | 9/2014 | Ominami et al. | |

FOREIGN PATENT DOCUMENTS

| | | | |
|---|---|---|---|
| JP | 2007-66715 | A | 3/2007 |
| JP | 2009-238426 | A | 10/2009 |
| JP | 2010-56011 | A | 3/2010 |
| WO | WO 2013/051357 | A1 | 4/2013 |

* cited by examiner

CHARGED PARTICLE BEAM DEVICE AND FILTER MEMBER

TECHNICAL FIELD

The present invention relates to charged particle beam devices which enable observations under predetermined gas ambiences in states of being at an atmospheric pressure or at slightly-negative pressures with respect to the atmospheric pressure.

BACKGROUND ART

In order to observe fine areas in objects, there have been used scanning electron microscopes (SEMs), transmission electron microscopes (TEMs) and the like. In general, these devices are adapted to evacuate a casing for placing a sample therein for bringing the ambience around the sample into a vacuum state and, further, are adapted to capture images of the sample. However, biochemical samples, liquid samples and the like are damaged or changed in state by the vacuum. On the other hand, there have been greater needs for observing such samples with electron microscopes and, in recent years, there have been developed SEM devices, sample holding devices and the like which enable observations of to-be-observed samples under an atmospheric pressure.

These devices are adapted, in principle, to separate a vacuum state and an atmospheric-air state from each other, through a diaphragm capable of transmitting electron beams therethrough, which is provided between an electrooptic system and a sample. These devices have a commonality in that they all have the diaphragm provided between the sample and the electrooptic system.

For example, PTL 1 discloses a SEM including an electrooptic barrel placed such that an electron source therein is faced downwardly and, also, an objective lens therein is faced upwardly, and a diaphragm capable of transmitting electron beams therethrough, which is provided on an electron-beam emitting hole at the distal end of the electrooptic barrel with an O ring interposed therebetween. The invention described in this literature is adapted to place a liquid containing a to-be-observed sample, directly, on the diaphragm further to direct a primary electron beam to the sample at its lower surface and to detect reflected electrons or secondary electrons for attaining SEM observations. The sample is held in the space formed by the diaphragm and an annular member installed around the diaphragm and, further, this space is interiorly filled with a liquid such as water.

CITATION LIST

Patent Literature

PTL 1: JP 2009-238426 A (US 2009/0242762 A)

SUMMARY OF INVENTION

Technical Problem

In such a SEM device which enables observations under an atmospheric pressure, in the event that the diaphragm is damaged during an observation of a sample, air flows into the charged particle optical barrel from the vicinity of the sample, due to the differential pressure between the inside of the charged particle optical barrel under vacuum and the vicinity of the sample under the atmospheric pressure. At this time, in cases of samples which are difficult to secure to a sample table, such as liquid and gel-type samples, or hydrous samples, such samples may be sucked into the charged particle optical barrel. In this case, the charged particle optical system and the detector may be contaminated thereby, which causes performance degradation or failures of the charged particle microscope.

For coping therewith, there is a need for a protection mechanism for preventing contaminations, in the event of a fracture of the diaphragm. For example, in PTL 1, there is provided a partition member for separating the sample and the charged particle optical barrel from each other and, further, there is provided a mechanism which is adapted to monitor the degree of vacuum for detecting a fracture of the diaphragm and to close the partition member for preventing the sample from flowing into the charged particle optical barrel. However, it is necessary to additionally provide the partition member, and a driving system and a control system for the partition member, thereby inducing the problem of complicacy of the device structure. Further, it is unavoidable to induce a time lag until the operation of the partition-member driving system since a change of the degree of vacuum is monitored, thereby inducing contaminations in the time lag.

The present invention was made in view of the aforementioned problem and aims at providing a charged particle beam device capable of preventing contaminations of a charged particle optical barrel without inducing a time lag with a simple structure, in a SEM device capable of observations under an atmospheric pressure.

Solution to Problem

To solve the above problem, the present invention provides, in a charged particle beam device adapted to place a sample in a non-vacuum environment, a filter member which is placed on a path of the primary charged particle beam at least in a state where the primary charged particle beam is directed to the sample and, further, is adapted to transmit or pass, therethrough, the primary charged particle beam and a secondary charged particle derived from the sample, while intercepting at least a portion of a scattering substance which is scattered in the event of a fracture of the diaphragm.

Advantageous Effects of Invention

With the present invention, it is possible to effectively reduce the possibility that the charged particle optical barrel is contaminated by samples, without inducing a time lag, with a simple structure.

Other objects, structures and effects than those described above will be apparent from the following description of embodiments.

BRIEF DESCRIPTION OF DRAWINGS

FIGS. 6A and 613 are views of details around the filter.

DESCRIPTION OF EMBODIMENTS

Hereinafter, respective embodiments will be described, with reference to the drawings.

Hereinafter, a charged particle beam microscope will be described as an example of the charged particle beam device. However, this is merely an example of the present invention, and the present invention is not intended to be limited to the embodiments which will be described later. The present invention is applicable to scanning electron microscopes, scanning ion microscopes, scanning transmission electron microscopes, composite devices constituted by these devices and sample processing devices, or analysis/inspection devices utilizing them.

Further, in the present specification, the term "atmospheric pressure" means pressure environments in states of being at an atmospheric pressure or at slightly-negative pressures, under an atmospheric-air ambience or under a predetermined gas ambience. More specifically, it refers to pressures in the range of about $10^5$ Pa (atmospheric pressure) to $10^3$ Pa.

Example 1

The Device Structure

Figure 1:
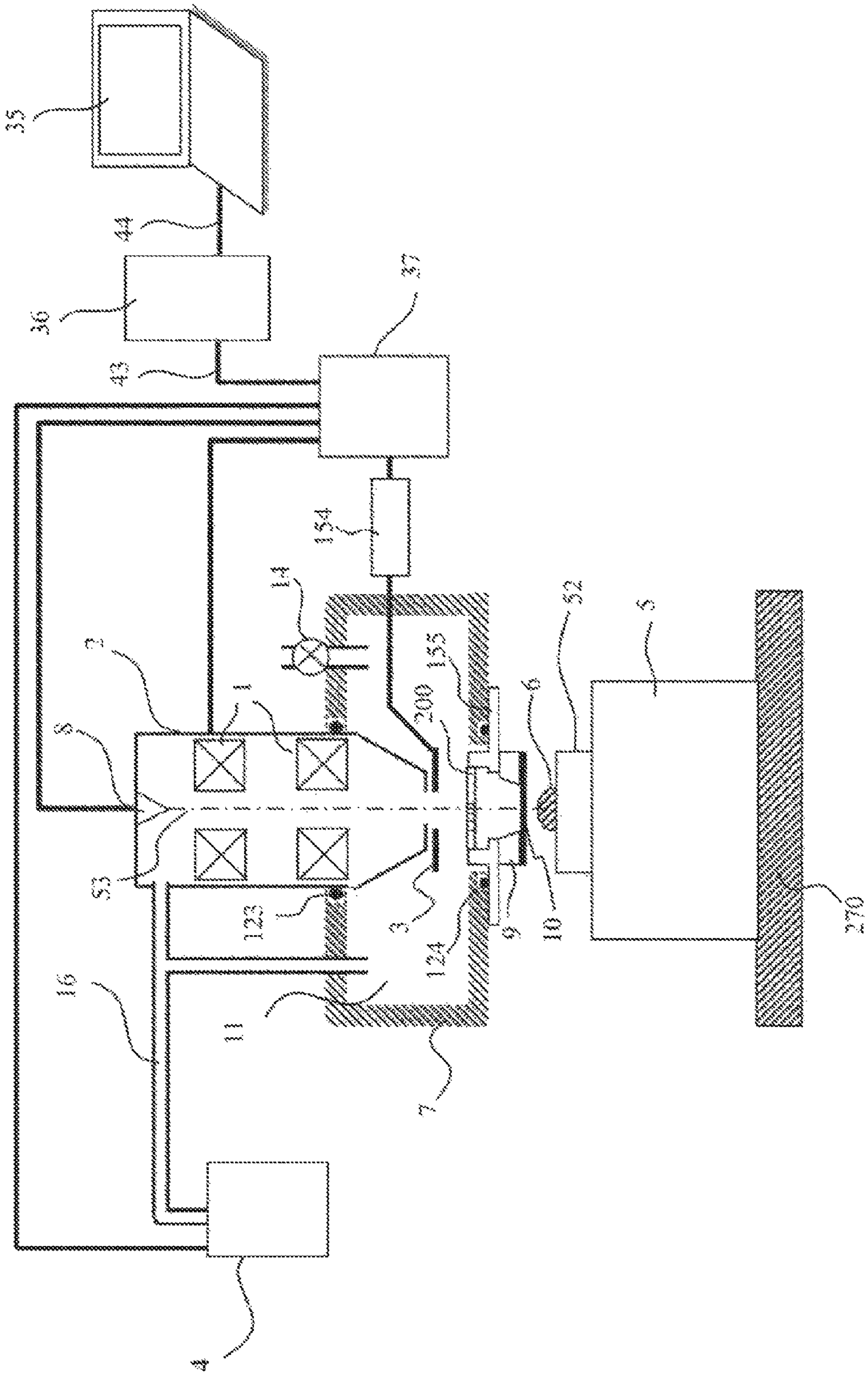
FIG. 1 is a view of the entire structure of a charged particle microscope in Example 1.

In the present example, a basic embodiment will be described. FIG. 1 illustrates a view of the entire structure of a charged particle microscope in the present example.

The charged particle microscope illustrated in FIG. 1 is mainly constituted by a charged particle optical barrel 2, a casing (vacuum chamber) 7 which is connected to the charged particle optical barrel 2 and is adapted to support it, a sample stage 5 placed under an atmospheric-air ambience, and a control system adapted to control them. When the charged particle microscope is used, the insides of the charged particle optical barrel 2 and the first casing are evacuated by a vacuum pump 4. The control system also controls operations for activating and stopping the vacuum pump 4. Only the single vacuum pump 4 is illustrated in the figure, but two or more vacuum pumps can be provided. It is assumed that the charged particle optical barrel 2 and the casing 7 are supported by being secured to a pedestal 270 through columns and the like, which are not illustrated.

The charged particle optical barrel 2 is constituted by a charged particle source 8 for generating a charged particle beam, optical lenses 1 for condensing the generated charged particle beam and for directing it to a barrel lower portion for scanning a sample 6 using it as a primary charged particle beam, and other components. The charged particle optical barrel 2 is installed in such a way as to protrude inside the casing 7 and is secured to the casing 7 with a vacuum sealing member 123 interposed therebetween. At an end portion of the charged particle optical barrel 2, there is placed a detector 3 for detecting secondary charged particles (secondary electrons or reflected electrons) which are resulted from the irradiation of the aforementioned primary charged particle beam.

The charged particle microscope in the present example includes a computer 35 which is used by a device user, a higher-order control portion 36 which is connected to the computer 35 and is adapted to communicate therewith, and a lower-order control portion 37 adapted to control the evacuation system and the charged particle optical system according to commands sent from the higher-order control portion 36. The computer 35 includes a monitor adapted to display a screen for manipulating the device (GUI), and a means for performing inputting to the manipulation screen, such as a key board and a mouse. The higher-order control portion 36, the lower-order control portion 37 and the computer 35 are connected to each other through respective communication lines 43 and 44.

The lower-order control portion 37, which is a portion for transmitting and receiving control signals for controlling the vacuum pump 4, the charged particle source 8, the optical lenses 1 and the like, is adapted to convert output signals from the detector 3 into digital image signals and to transmit the digital image signals to the higher-order control portion 36. In the figure, the output signals from the detector 3 are connected to the lower-order control portion 37, through an amplifier 154, such as a preamplifier. The amplifier can be eliminated, if it is unnecessary.

The higher-order control portion 36 and the lower-order control portion 37 can include analog circuits and digital circuits such that they are mixed. Also, the higher-order control portion 36 and the lower-order control portion 37 can be integrated into a single portion. Further, the structure of the control system illustrated in FIG. 1 is merely illustrative, and modification examples such as control units, valves, vacuum pumps and communication wirings belong to the scope of the SEM or the charged particle beam device in the present example, provided that they satisfy the functions intended in the present example.

A vacuum pipe 16 connected at its one end to the vacuum pump 4 is connected to the casing 7, so that the inside of the casing 7 can be maintained at a vacuum state. At the same time, the casing 7 includes a leak valve 14 for opening the inside of the casing to the atmosphere, which enables opening the inside of the casing 7 to the atmosphere during maintenance and the like. It is also possible to eliminate the leak valve 14. Also, it is possible to provide two or more leak valves. Further, the position at which the leak valve 14 is placed in the casing 7 is not limited to the portion illustrated in FIG. 1, and the leak valve 14 can be also placed at a different position on the casing 7.

A diaphragm 10 is provided at a position beneath the aforementioned charged particle optical barrel 2 on the lower surface of the casing. The diaphragm 10 is capable of transmitting or passing, therethrough, the primary charged particle beam emitted from the lower end of the charged particle optical barrel 2, so that the primary charged particle beam passes through the diaphragm 10 and finally reaches the sample 6 mounted on a sample table 52. The closed space created by the diaphragm 10 can be evacuated. Accordingly, in the present example, the space being evacuated is maintained at an airtight state by the diaphragm 10, which enables maintaining the charged particle optical barrel 2 at a vacuum state and also maintaining the sample 6 under an atmospheric pressure during observations. Further, during observations, the sample 6 can be arbitrarily exchanged.

The diaphragm 10 is formed on a pedestal 9 by deposition or vapor deposition. The diaphragm 10 is formed from a carbon material, an organic material, a metal material, silicon nitride, silicon carbide, silicon oxide or the like. The pedestal 9 is a member made of silicon or a metal material, for example. The diaphragm 10 portion can be also constituted by a plurality of windows placed therein. The diaphragm capable of transmitting or passing, therethrough, the primary charged particle beam has a thickness of about several nanometers to several micrometers. The diaphragm is required not to be fractured under a differential pressure necessary for separating the atmospheric pressure and the vacuum from each other. Therefore, the diaphragm 10 has an area with a size of several tens of micrometers to several millimeters at maximum. The shape of the diaphragm 10 can be a rectangular shape or other shapes, instead of a square shape. The shape thereof can be any shape.

The pedestal 9 for supporting the diaphragm 10 is provided on a diaphragm holding member 155. Although not illustrated, it is assumed that the pedestal 9 and the diaphragm holding member 155 are adhered to each other, through an adhesive agent, a double-sided tape or the like which is capable of vacuum sealing. The diaphragm holding member 155 is detachably secured to the lower surface of the casing 7 with a vacuum sealing member 124 interposed therebetween. The diaphragm 10 has a significantly smaller thickness, which falls within the range of about several nanometers to several micrometers, since it is required to transmit charged particle beams therethrough. Therefore, the diaphragm 10 may be fractured due to temporal degradation or during preparations for observations. Further, when the diaphragm 10 and the pedestal 9 for supporting it are small, they are significantly hard to directly handle. Therefore, by integrating the diaphragm 10 and the pedestal 9 with the diaphragm holding member 155 for enabling the pedestal 9 to be handled through the diaphragm holding member 155 rather than directly, as in the present example, it is possible to significantly facilitate handling (particularly, replacement) of the diaphragm 10 and the pedestal 9. Namely, in the event of a fracture of the diaphragm 10, it is possible to replace the entire diaphragm holding member 155. Even if the diaphragm 10 is required to be directly replaced, it is possible to extract the diaphragm holding member 155 to the outside of the device and to replace the entire diaphragm 10 or the entire pedestal 9 outside the device.

The diaphragm 10 is significantly thin and, therefore, is fractured by being brought into contact with the sample and due to temporal degradation thereof. In the event of a fracture of the diaphragm 10 during observations or during preparations for observations, air flows into the charged particle optical barrel 2 from the space around the sample 6, due to the air pressure difference between the vicinity of the sample 6 being under the atmospheric pressure and the inside of the charged particle optical barrel 2 being under vacuum. At this time, in cases of samples which are difficult to secure to the sample table 52, such as powdery, liquid and gel-type samples, or hydrous samples, such samples may be sucked into the charged particle optical barrel 2. The inside of the charged particle optical barrel 2 and the detector 3 are contaminated by such sucked samples, which causes performance degradation or failures of the charged particle microscope.

The present structure includes a filter 200 just above the diaphragm 10. The filter 200 is secured on the diaphragm holding member 155. The filter 200 is adapted to pass or transmit, therethrough, the primary charged particle beam and the secondary charged particles while intercepting at least a portion of certain ferine substances (scattering substances) such as samples. The filter 200, which will be described later regarding its structure, can be constituted by a mesh and the like, for example.

Also, a valve for preventing contaminations can be provided therein, but this necessarily involves complication of the device structure and delays of operations of the valve. By continuously placing the filter 200 just above the diaphragm 10, as described above, it is possible to protect it from contaminations without time lags with the simple structure. In this case, the term "continuously" means that the filter is in the state of being placed on the path of the primary charged particle beam in the state where at least the primary charged particle beam is directed to the sample. The term "being placed on the path of the primary charged particle beam" means being in the state of being placed between the diaphragm and the charged particle optical barrel or between the diaphragm and the detector.

Under the diaphragm 10 included in the casing 7, there is provided the sample stage 5 placed under the atmospheric-air ambience. The sample stage 5 includes a Z-axis driving mechanism having a height adjustment function capable of bringing at least the sample 6 closer to the diaphragm 10. As a matter of course, it can also include an XY driving mechanism which is movable in sample in-plane directions.

In the examples which will be described later, preferable samples 6 are samples containing liquid. For example, they are liquid samples such as aqueous solutions, organic solvents, oils, sols, gels, jellies, and solids containing such liquids. In the present specification, samples which are "liquid" or "liquefied" collectively mean samples having unfixed forms, namely samples in general other than samples with solid surfaces, as exemplified above. In the following description, it is assumed that such liquid samples are to be subjected to observations, unless otherwise specified. However, this description is not intended to restrict the range of applications of the present invention, and the present invention is also effective in cases of samples which are not "liquid", such as powdery samples. Further, scattering substances are not limited to substances derived from samples and, also, broadly include substances sucked into the vacuum space due to the air pressure difference in the event of fractures of the diaphragm.

Figure 2:
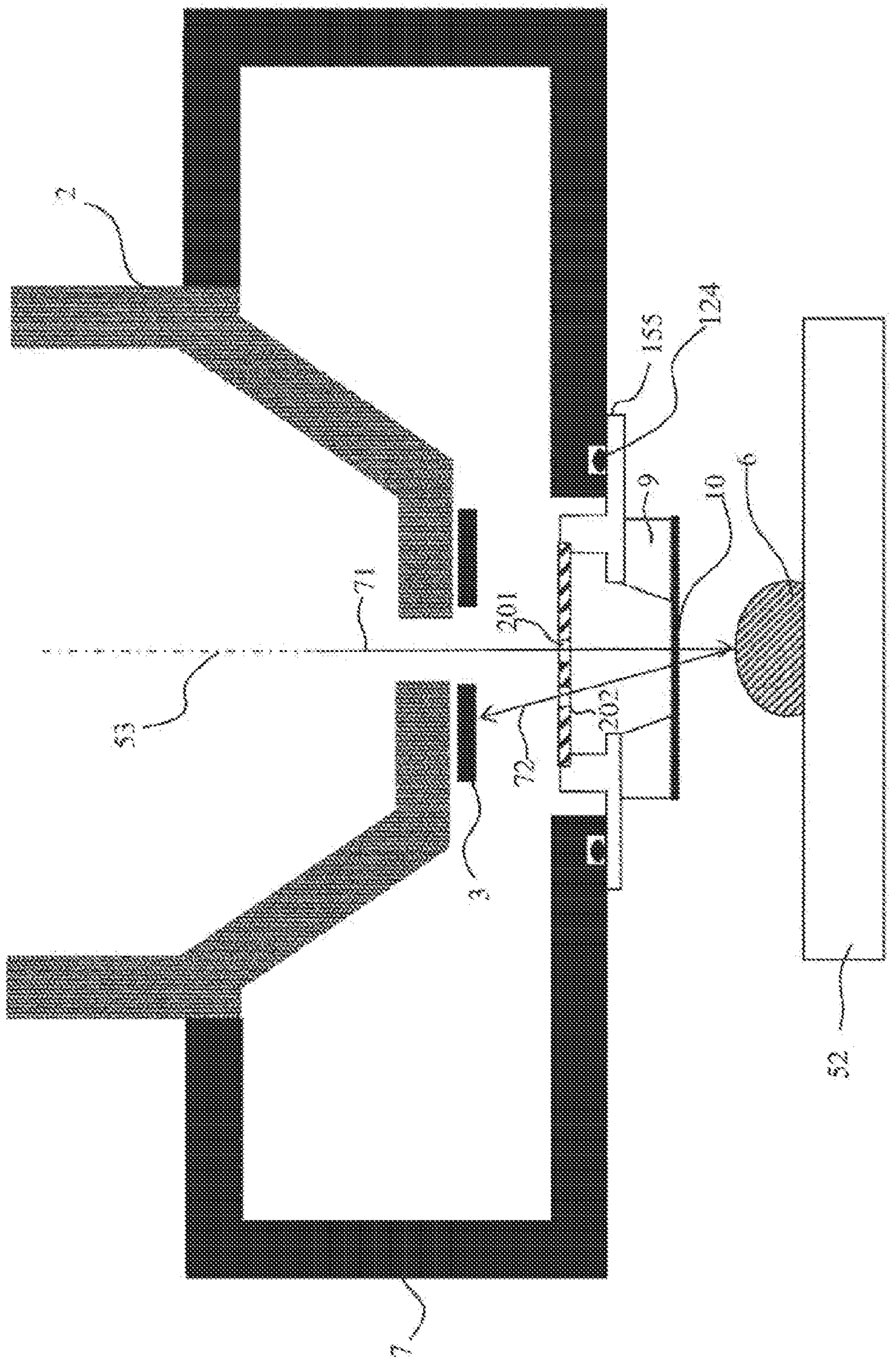
FIG. 2 is a view of details around a filter.

FIG. 2 illustrates a view of details around the filter 200. In the figure, a plate with circular-shaped holes 201 and 202 is exemplified as the filter 200, for giving the description thereof. A primary charged particle beam 71 passes through the hole 201 existing on the optical axis and is directed toward the sample 6. A secondary charged particle 72 passes through the hole 202 and reaches the detector 3. On the other hand, if the diaphragm 10 is damaged, and the liquid sample intrudes into the casing 7, a major part of the sample is absorbed or repelled by the plate surface of the filter 200. A portion of the sample reaches the opening portions of the holes 201 and 202. However, by making the hole diameters sufficiently smaller, it is possible to prevent the sample from passing through the holes 201 and 202 due to the surface tension and the viscosity of the liquid, thereby causing it to remain inside the holes 201 and 202 and in the lower side in the figure. As described above, it is possible to realize the filter 200 capable of transmitting the primary charged particle beam and the secondary charged particle beam therethrough, while intercepting ferine substances.

Although the sample can be trapped in the holes 201 and 202 due to the surface tension and the viscosity of the liquid, as described above, more effective structures will be described, hereinafter.

Figure 3A:
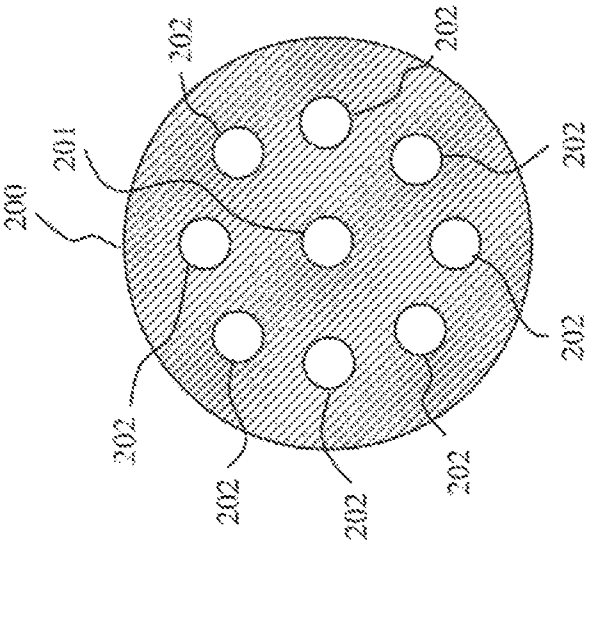
FIGS. 3A-3C are views of details of the filter.
Figure 3B:
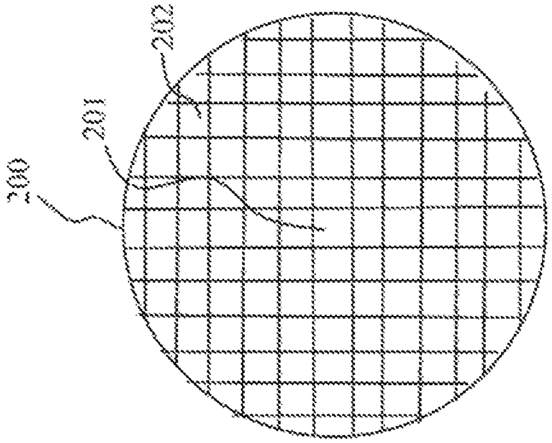
Figure 3C:
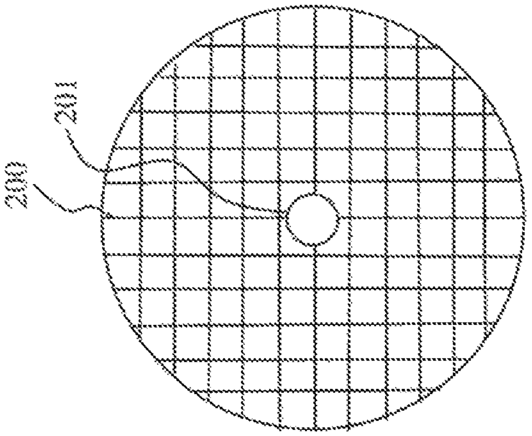

With reference to FIGS. 3(*a*) to (*c*), structures of the filter 200 will be described. FIGS. 3(*a*) to (*c*) are views of the filter 200 which is viewed from the charged particle optical barrel 2. The filter passes or transmits the primary charged particle beam and the secondary charged particle beam therethrough and also intercepts certain substances such as samples. While, in FIGS. 1 and 2, the member having the two holes 201 and 202 is used, there are countless paths along which reflected electron beams or secondary electron beams travel and, therefore, a plurality of electrons are intercepted by the filter, thereby reducing the S/N ratio. By providing two or more holes 202 for passing reflected electrons or secondary electrons therethrough, it is possible to improve the S/N ratio (FIG. 3(*a*)). If the number of holes is increased, this increases the possibility that the sample reaches the hole opening portions. However, by adjusting the hole diameters and the like for optimizing the opening areas, as described above, it is possible to prevent intrusion of the sample therein.

The holes 201 and 202 may have respective different shapes and sizes. Further, in the figure, they are illustrated as circular holes, but the hole shapes are not limited to circles and may be also other shapes. In order to intercept ferine substances, it is preferable that the hole opening areas are made smaller as much as possible. On the other hand, when the hole opening areas are made smaller, the primary charged particle beam and the secondary charged particle beam are intercepted thereby, which raises a concern about degradation of the S/N ratio. The primary charged particle beam 71 passes through the filter 200 within a range which is restricted as a value specific to the device. Therefore, by determining the shape and the size of the hole 201 for passing the primary charged particle beam therethrough in such a way as to form the hole 201 to be a hole having a rectangular shape or the like which conforms to the aforementioned range, it is possible to prevent the primary charged particle beam 71 from being intercepted, thereby maintaining a preferable S/N ratio, while intercepting foreign substances as much as possible.

Further, a mesh can be used as the filter 200 (FIG. 3(*b*)). Similarly to in cases of using a plate with holes, the charged particle beam passes through an opening portion in the mesh, and the liquid is trapped by the mesh. In cases of using a plate with holes, there are limits to the hole sizes, the hole intervals and the like, due to constraints of machining and the like, even if an attempt is made to increase the number of holes. By using a mesh, it is possible to easily increase the number of holes. The filter may have a mesh structure only at a portion thereof.

The filter 200 can be also provided with a hole 201 for passing the primary charged particle beam therethrough, around the mesh center (see FIG. 3(*c*)). This enables observing the sample without preventing the mesh from intercepting the field of view.

Surface treatment can be applied to the surface of the filter 200. The surface treatment method can be selected according to the sample to be intercepted. For example, in cases of samples containing water, hydrophilic treatment can be applied to the filter 200, which enables effectively trapping the sample therein. The aforementioned description is merely an example, and the filter 200 may be also made to have hydrophobicity to have the effect of repelling water, in cases of samples containing water. Namely, by selectively using hydrophilic or hydrophobic treatment depending on physical properties (the viscosity, surface tension and the like) of the sample, it is possible to enhance the trapping effect. In this case, such surface treatment includes adjustments of mechanical characteristics such as surface roughness, as well as formation of coats made of different materials on the surface through plating, coating, chemical formation treatment, and the like.

Further, it is desirable that the filter 200 has electrical conductivity, since electric charges carried by the filter 200 may influence the primary or secondary electron beam, because it is required to pass electron beams therethrough. Even the filter 200 made of a material with no electrical conductivity can be improved in electrical conductivity, through vapor deposition and the like of a metal or carbon thereon.

Figure 4:
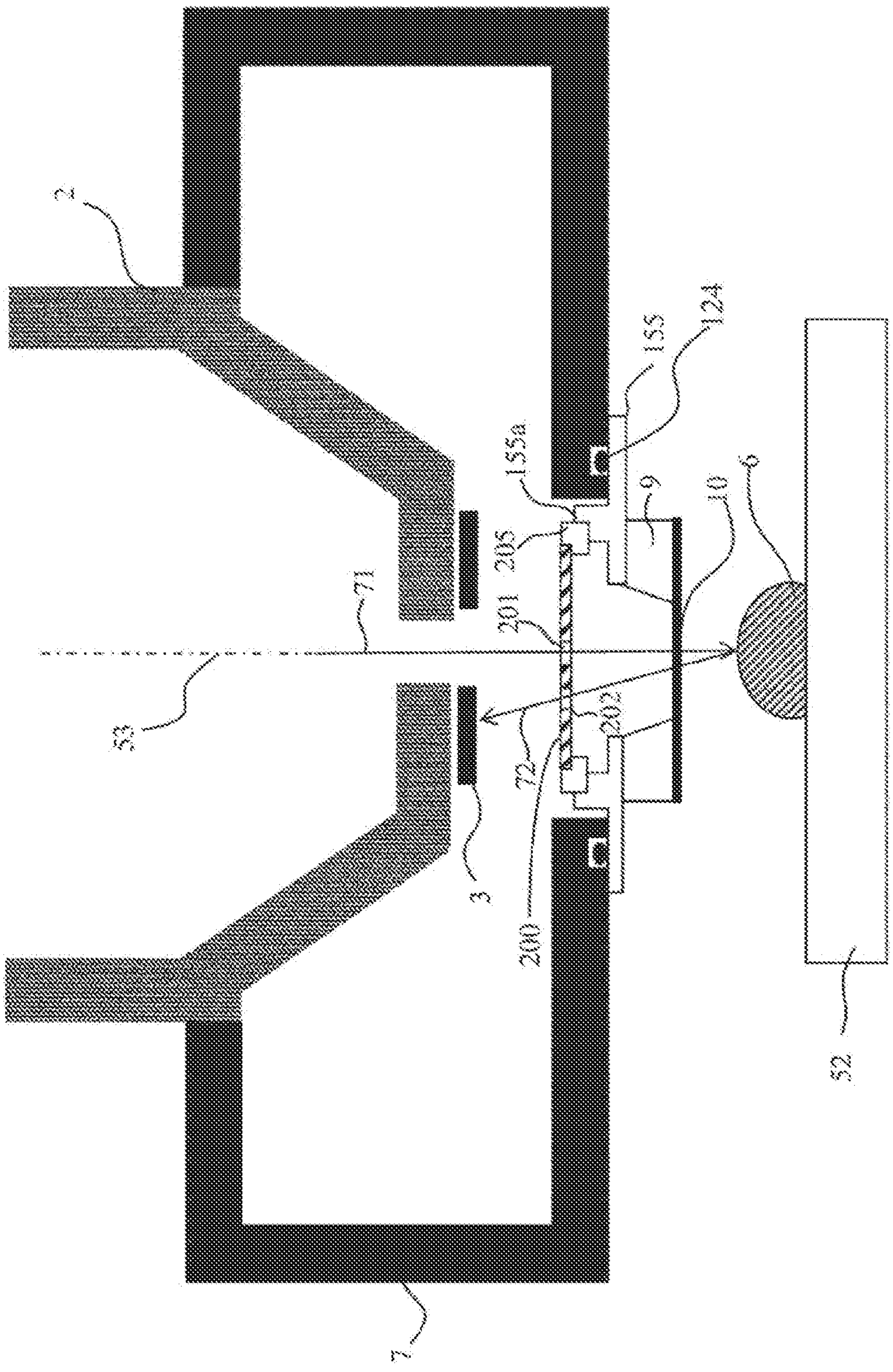
FIG. 4 is a view of details around the filter.

FIG. 4 illustrates a view of a structure employing a filter holding member 205. The filter 200 is required to be cleaned or replaced in the event of adhesion of samples thereto. By mounting the filter 200 such that it can be easily detached, it is possible to improve the convenience thereof during maintenance. With the present structure, the filter 200 is detachably secured on the diaphragm holding member 155, with a filter holding member 205 interposed therebetween, through double-sided tapes, hook and loop fasteners, tacks and the like, which are not illustrated. During maintenance, the diaphragm holding member 155, to which the diaphragm 10 and the filter 200 are mounted, is entirely detached, and the filter 200 is detached from the diaphragm holding member 155 outside the device and is cleaned or replaced. When samples have been adhered to the filter 200 and it is necessary to perform maintenance thereon, that is, the diaphragm 10 has been damaged. With this structure, it is possible to concurrently detach the diaphragm 10 and the filter 200, which are required to be subjected to maintenance at the same time. This enables performing maintenance thereof with excellent convenience. As a matter of course, the filter 200 and the filter holding member 205 can be formed integrally with each other. In cases where the filter 200 can be handled with excellent convenience, the filter 200 can be directly secured to the diaphragm holding member 155 without using the filter holding member 205.

Since the diaphragm 10 has a significantly-smaller area as described above and, also, the filter 200 has small openings for effectively trapping the sample, if the diaphragm 10 is deviated from the position of the opening in the filter 200, this may make it impossible to pass the primary charged particle beam therethrough. Therefore, in mounting the filter 200 to the thin-film holding member 155, it is necessary to make the position of the opening in the filter 200 coincident with the range of the field of view of the diaphragm 10. With the present structure, the diaphragm holding member 155 has a position-setting portion 155*a*, in order to set the positional relationship between the filter member and the diaphragm holding member at a predetermined position. The position-setting portion 155*a* is constituted by a positioning rib having an L-shaped structure, for example. By pressing or fitting the filter holding member 205, on which the filter 200 is mounted, to the position-setting portion 155*a*, it is possible to attain positioning of the diaphragm 10 and the filter 200. As a matter of course, the filter 200 and the filter holding member 205 can be formed integrally with each other. In cases where sufficient positioning accuracy can be expected, the filter 200 can be directly secured to the diaphragm holding member 155 without using the filter holding member 205.

Figures 5A, 5B, 5C, 5D:
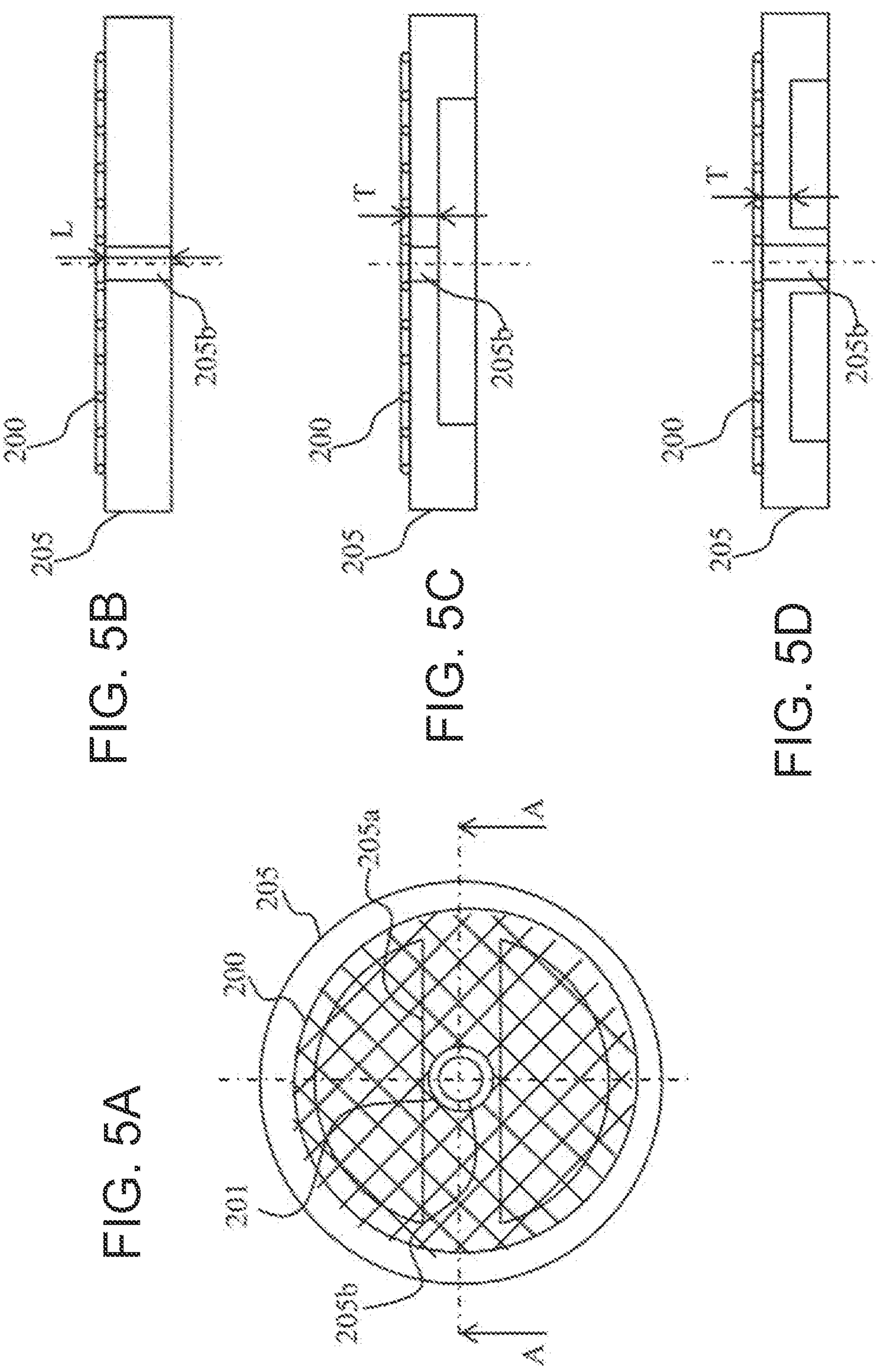
FIGS. 5A-5D are views of details of the filter.

FIGS. 5(*a*) to (*d*) illustrate details of the filter 200. FIG. 5(*a*) is a view of the filter 200 which is viewed from the charged particle optical barrel 2, and FIGS. 5(*b*) to (*d*) are views taken in the direction of arrows A-A in FIG. 5(*a*). Here, the filter will be described, with respect to a structure employing a mesh with a hole 201 at the center, as an example (FIG. 5(*a*)). With this structure, the filter holding member 205 is provided with a beam 205*a* at its center portion, and the filter holding member 205 is further is provided with a hole 205*b* at a center position therein. The filter 200 is mechanically secured to the filter holding member 205, through an adhesive agent, double-sided tapes, tacks and the like, which are not illustrated, such that the hole 205*b* is coincident with the center of the hole 201 at the center of the filter.

During replacement of the filter and during storage thereof, the mesh and the like in the filter 200 may be easily deformed by external forces, thereby inducing positional deviations of the hole 201 and the like. By supporting the filter 200 using the beam 205*a* as in the present structure, it is possible to prevent deformations of the filter 200.

Although the filter 200 has the hole 201 at its center for preventing the transmission of the primary charged particle beam from being obstructed thereby, the sample may intrude through the hole 201. The present structure has the beam 205*a* portion of the filter holding member 205 around the hole 201 portion, which can prevent intrusion of the sample therein, due to hydrodynamic resistances such as friction in the inner surface of the hole 205*b* in the beam 205*a* portion (FIG. 5(*b*)). As the distance L from the inlet of the hole to the outlet thereof is increased, there are larger hydrodynamic resistances, thereby increasing the effect of preventing the intrusion of the sample therein. This is particularly effective, in cases of samples with higher viscosities, such as gels.

The beam 205*a* portion intercepts the secondary electron beam or reflected electron beams, thereby reducing the S/N ratio. By partially reducing the thickness T of the beam 205*a* portion, it is also possible to improve the S/N ratio. FIG. 5(*c*) illustrates an example where the beam 205*a* in the filter holding member 205 is made to have a smaller thickness in its center portion sandwiching the hole 205*b*, than in the other portion. By making the beam have a smaller thickness around its center, as in FIG. 5(*c*), it is possible to improve the S/N ratio. Further, FIG. 5(*d*) illustrates an example where the beam 205*a* is made to have a smaller thickness between its center portion sandwiching the hole 205*b* and the outer peripheral portion of the filter holding member 205, in comparison with the center portion and the outer peripheral portion. By making the beam have a larger thickness around the hole 205*b* at the center while making it have a smaller thickness therearound as in FIG. 5(*d*), it is possible to improve the S/N ratio, while maintaining the aforementioned distance L for suppressing intrusion of the sample through the hole 201.

The positioning of the filter 200 and the diaphragm 10 is attained by fitting the filter holding member 205 to the diaphragm holding member 155 and the like as described above. For attaining this, it is necessary that the axes of the filter 200 and the filter holding member 205 are coincident with each other. With the present structure, it is possible to easily make their axes coincident with each other, by making the hole 205*b* at the center of the filter holding member 205 coincident with the center of the filter 200. Although the structure employing a mesh as the filter 200 has been described as an example, it goes without saying that the present invention is applicable to other types of filters.

Figure 6B:
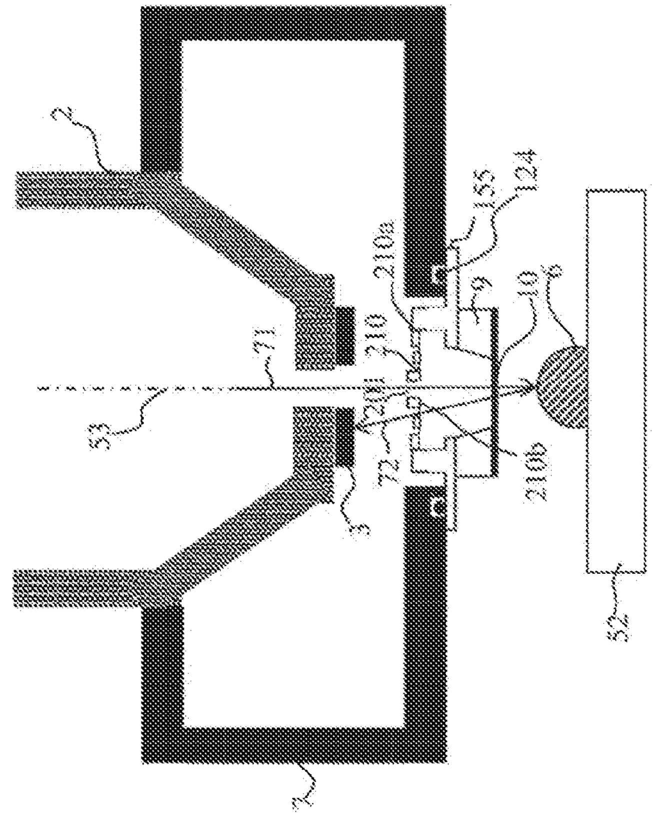
Figure 6A:
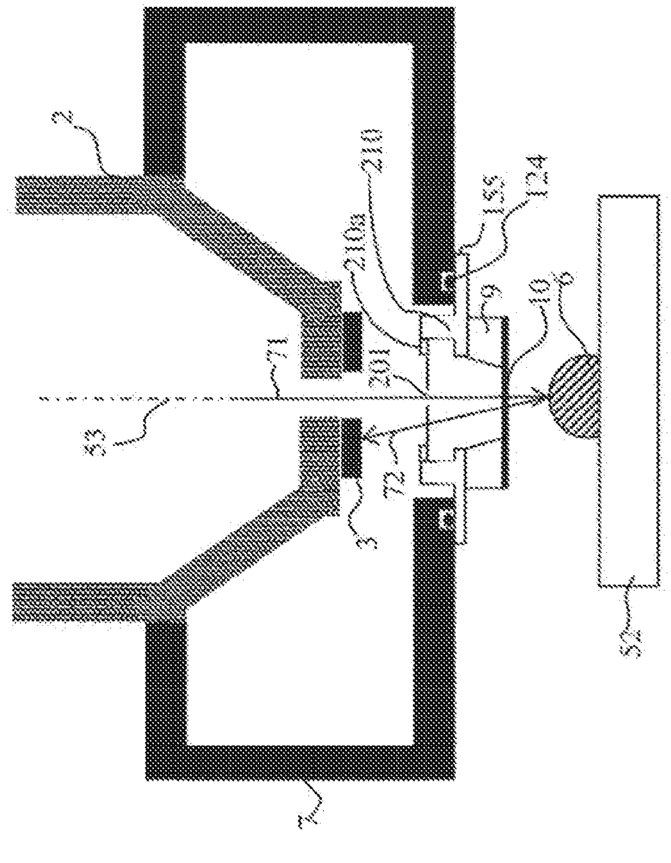

Although a plate with holes and a mesh are preferable as the filter 200, other types of filters will be described. FIGS. 6(*a*) and (*b*) illustrate a structure employing a thin film 210 for passing or transmitting, therethrough, charged particle beams, particularly secondary charged particles. In the figure, the thin film 210 is secured to the diaphragm holding member 155, but the thin film may be also secured to the diaphragm holding member 155 with a filter holding member (not illustrated) interposed therebetween, similarly to the aforementioned filter 200. The thin film 210 has a hole 201 for passing or transmitting a primary charged particle beam therethrough, at the center thereof. By using the thin film 210 for transmitting the charged particle beam therethrough as the filter, it is possible to suppress the degradation of the S/N ratio, in comparison with cases of a plate with holes and a mesh.

The thin film 210 is formed on a pedestal 210*a* by deposition or vapor deposition, similarly to the diaphragm 10 (FIG. 6(*a*)). The thin film 210 is formed from a carbon material, an organic material, a metal material, silicon nitride, silicon carbide, silicon oxide or the like. The pedestal 210*a* is a member made of silicon or a metal material, for example. The thin film 210 portion can be also constituted by a plurality of windows placed therein. The thin film capable of transmitting or passing, therethrough, the primary charged particle beam has a thickness of about several nanometers to several micrometers, and the thin film 210 may be torn by samples adhered thereto. In order to reinforce the thin film 210, the thin film may be provided with a bar-shaped reinforcement member 210*b* on its surface (FIG. 6(*b*)). The reinforcement member 210*b* mad be formed through the same processing as that for the thin film 210 or may be mechanically connected to the thin film 210 by adhering the reinforcement member 210*b* thereto, and the like. This can make the thin film 210 have higher strength.

Also, the reinforcement member 210*b* can be placed in such a way as to surround the periphery of the hole 201, which can efficiently prevent intrusion of samples therein due to hydrodynamic resistances as described above.

Figure 7:
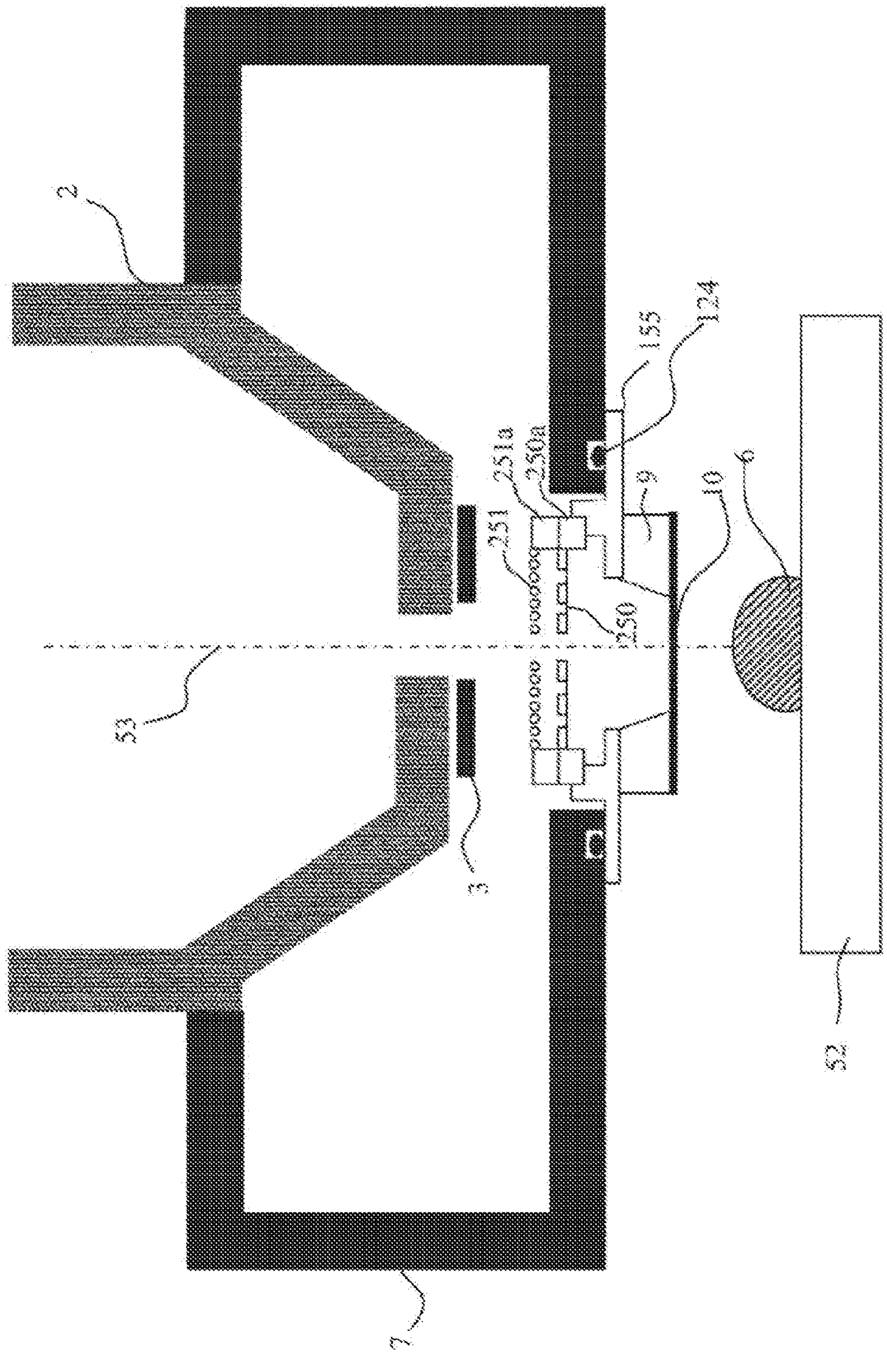
FIG. 7 is a view of details around a filter.

Although various types of filters have been described hereinbefore, it is also possible to employ a combination of them. FIG. 7 illustrates an example of a combination of a filter 250 employing a thin film (hereinafter, referred to as a thin-film filter), and a filter 251 employing a mesh (hereinafter, referred to as a mesh filter). The thin-film filter 250 is secured on a thin-film holding member 155 with a filter holding member 250*a* interposed therebetween, and, further, the mesh filter 251 is secured thereto with a filter holding member 251*a* interposed therebetween. Namely, the thin-film filter 250 and the mesh filter 251 are placed in a serial manner. If a sample intrudes through a fractured portion in the diaphragm, it is trapped by the thin-film filter 250, at first. If the thin-film filter 250 is damaged due to continuous intrusions of samples and the like, the mesh filter 251 traps samples. By combining two or more filters, as described above, it is possible to stably prevent intrusions of samples. Although the thin-film filter 250 and the mesh filter 251 have been described as an example, it is also possible to combine other filters, and it is possible to combine plural filters of the same type, as a matter of course. Also, it is possible to place filters in three or more stages, as well as in two stages. In the aforementioned manner, it is possible to stably prevent intrusions of samples.

Figure 8:
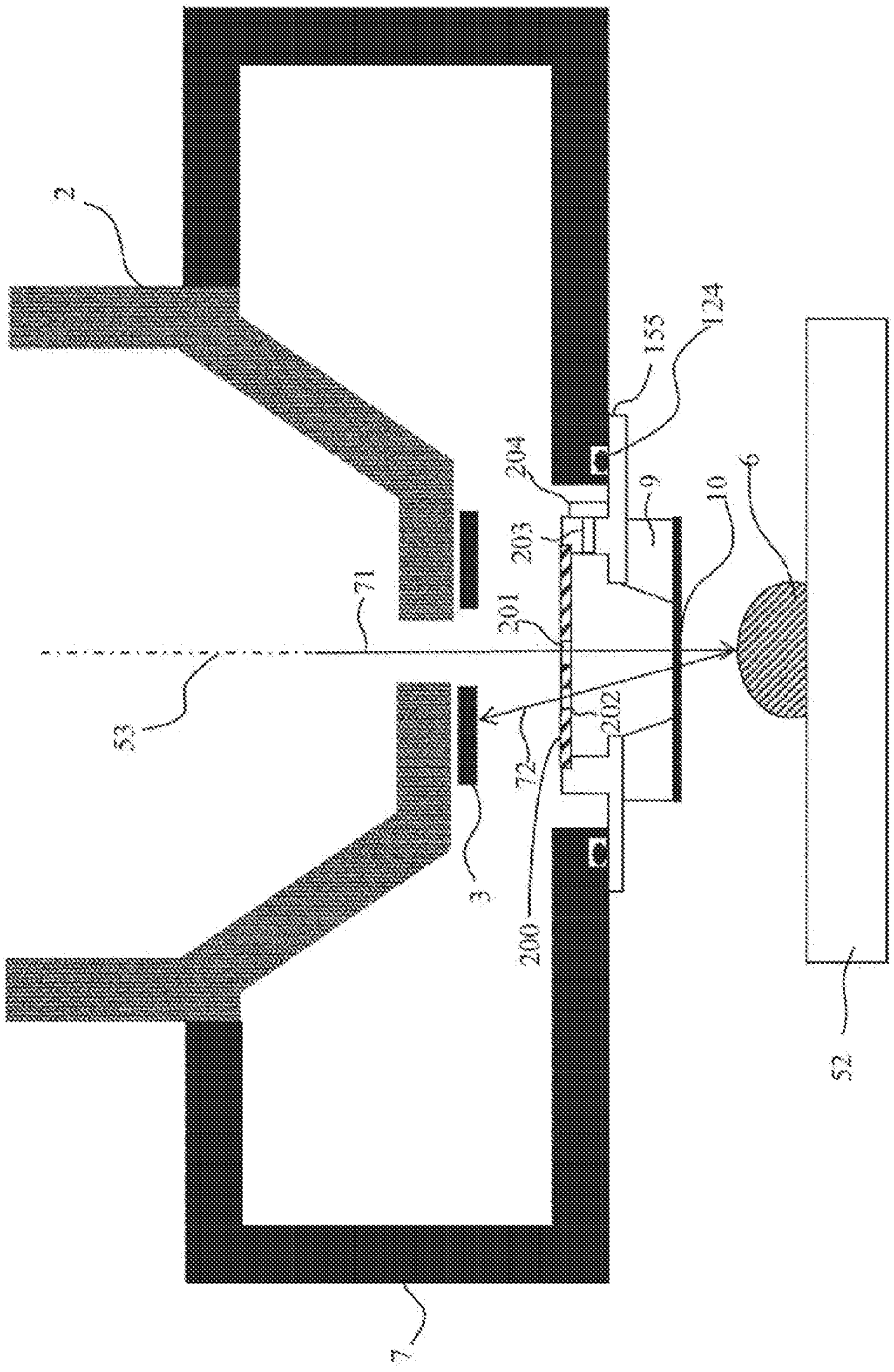
FIG. 8 is a view of details around a filter.

FIG. 8 illustrates a view of the structure of a device including an air vent hole. In the event of a fracture of the diaphragm 10, air flows therein due to the differential pressure between the inside of the charged particle optical barrel 2 and the vicinity of the sample 6, as described above. The air flowed therein passes through the hole 201 and 202 portions and flows into the charged particle optical barrel 2. At this time, the sample trapped in the holes 201 and 202 portions may be blown away by the air flowed therein and may be intruded into the charged particle optical barrel 2. With this structure, an air vent hole 203 may be provided at a position spaced apart from an optical axis 53. The air vent hole 203 is provided at a position outside the filter itself, in such a way as to communicate the space sandwiched between the diaphragm 10 and the filter 200 with the inside of the casing 7. For example, it can be provided in the diaphragm holding member 155. Through the air vent hole 203, the gas flowed into the charged particle optical barrel from the vicinity of the diaphragm due to the differential pressure is discharged, at least partially, to the inside of the casing, in the event of a fracture of the diaphragm. The gas discharged therethrough is directly exhausted by the vacuum pump. By making the air vent hole 203 have a sufficiently larger opening area in comparison with the holes 201 and 202, it is possible to reduce the aforementioned differential pressure, thereby preventing the sample trapped by the hole 201 and 202 portions from intruding into the charged particle optical barrel 2. Near the air vent hole 203, there may be provided an interception member 204 for intercepting liquid while transmitting air therethrough. In this case, liquid intruded through the air vent hole 203 can be trapped by the member 204.

The interception member 204 is preferably made of a material capable of passing air therethrough while intercepting liquid, and examples thereof include sponges, porous materials, water absorption materials such as cloths and paper, and the like.

Figure 9A:
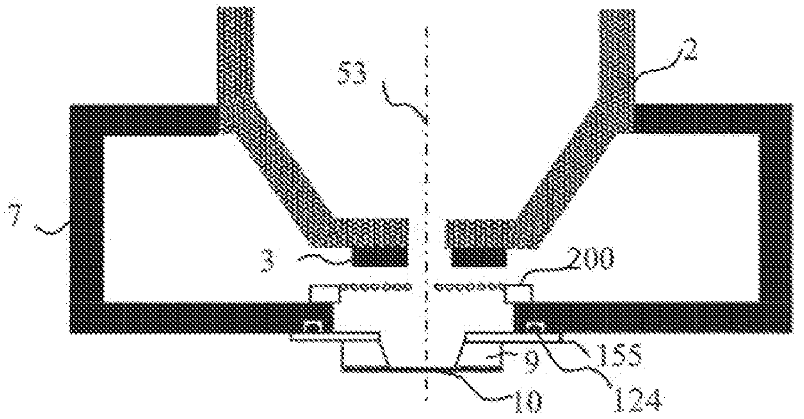
FIGS. 9A-9C are views of details around filters.
Figure 9B:
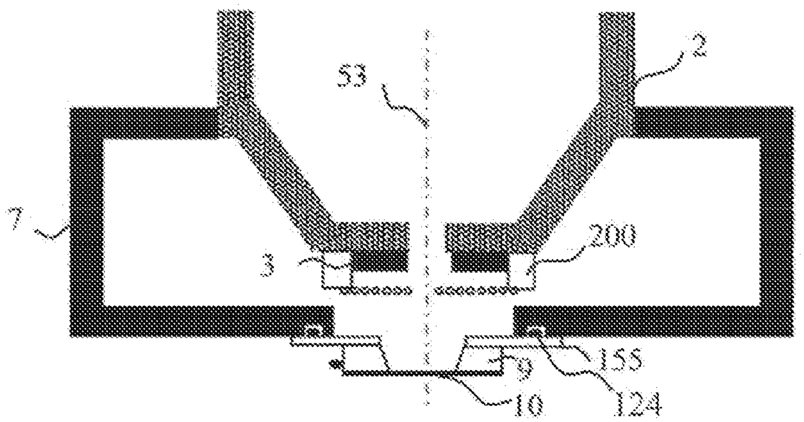
Figure 9C:
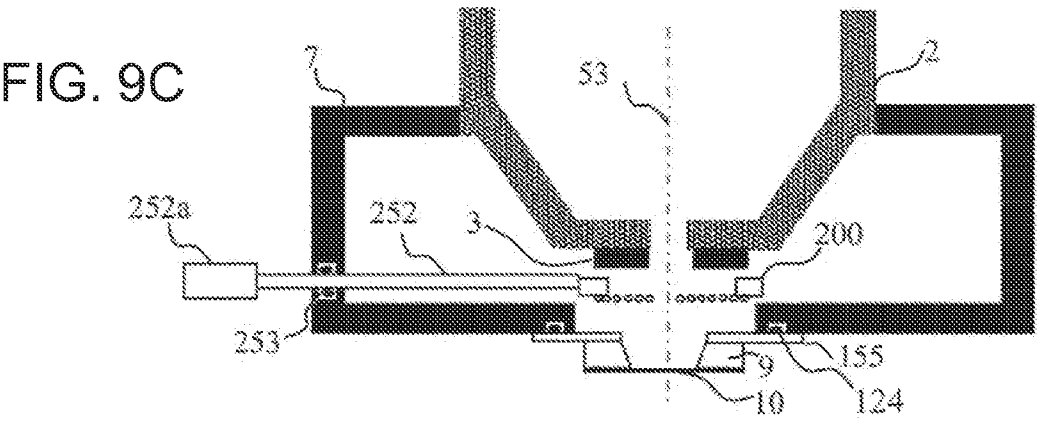

With reference to FIGS. 9(*a*) to (*c*), the placement of the filter 200 will be described. There has been previously described the structure for securing the filter 200 on the thin-film holding member 155, but it is necessary, in view of functions, only that the filter 200 can be placed between the thin film 10 and the detector 3, and it is also possible to employ a structure for securing it on the casing 7 (FIG. 9(*a*)), a structure for securing it to the charged particle optical barrel 2 or the detector 3 (FIG. 9(*b*)), or a structure for securing it to the casing 7 with a supporting member 252 interposed therebetween (FIG. 9(*c*)).

In the case of securing it to the casing 7 with the supporting member 252 interposed therebetween, the filter 200 may be secured thereto such that the filter 200 can be attached thereto and detached therefrom together with the supporting member 252 from the outside of the casing 7, while the vacuum is maintained therein by a vacuum sealing member 253. The supporting member 252 may be also provided with a handle 252*a*. This makes it easier to perform operations for attaching and detaching the filter 200 through a side surface and the like outside the casing 7, thereby improving the maintainability.

Example 2

Figure 10:
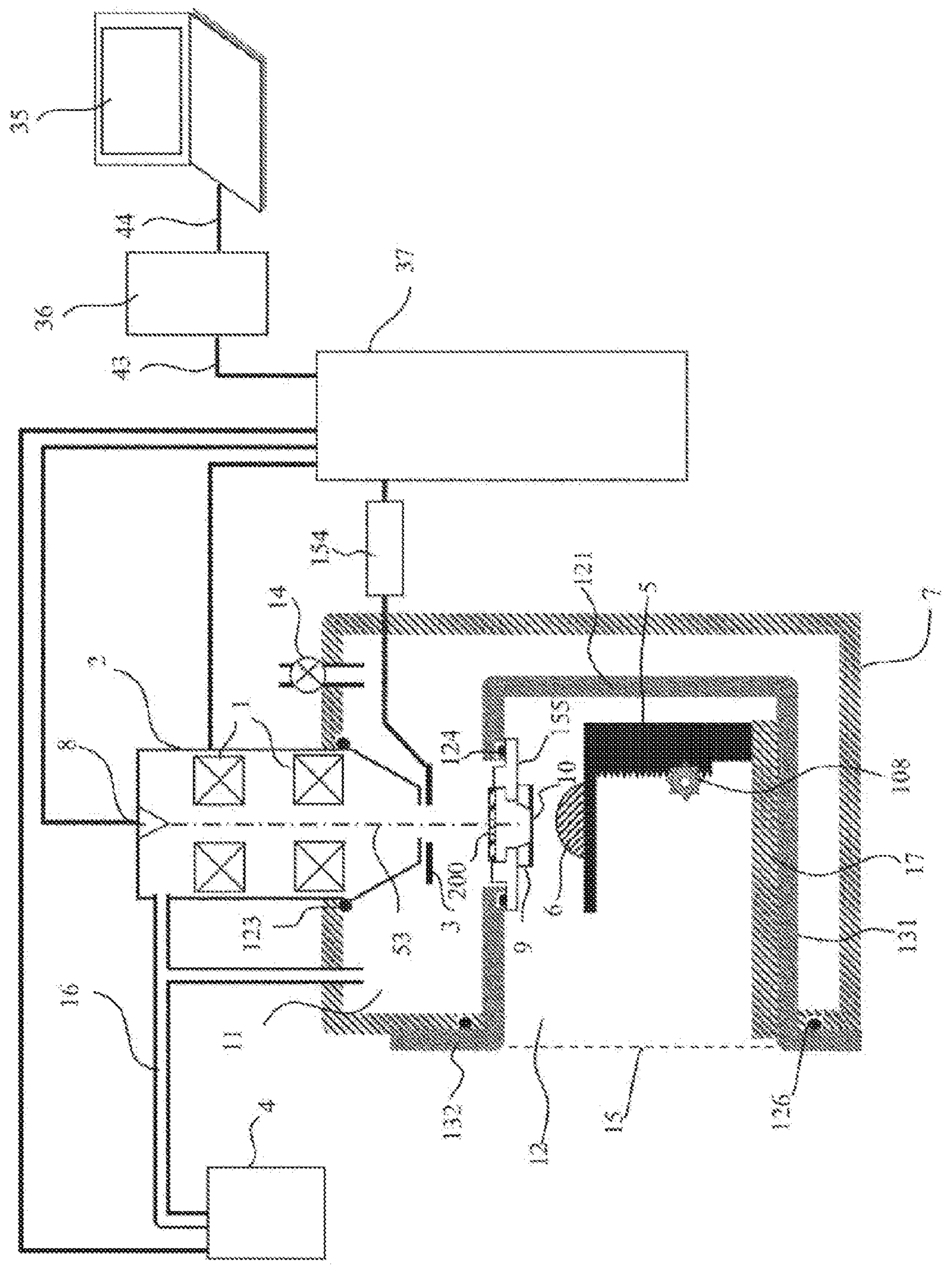
FIG. 10 is a view of the entire structure of a charged particle microscope in Example 2.

Hereinafter, there will be described a device structure which enables easily observing samples under an atmospheric air, with an ordinary charged particle beam device. FIG. 10 illustrates a view of the entire structure of a charged particle microscope in the present example. Similarly to in Example 1, the charged particle microscope in the present example is constituted by a charged particle optical barrel 2, a casing (vacuum chamber) 7 for supporting the charged particle optical barrel with respect to a device installation surface, a sample stage 5, and the like. Operations and functions of these respective components, and additional components provided in addition to these respective components are substantially the same as those in Example 1 and, therefore, will not be described in detail.

The present structure includes a second casing (attachment) 121 which is used by being inserted into the casing 7 (hereinafter, referred to as a first casing). The second casing 121 is constituted by a main body portion 131 having a rectangular parallelepiped shape, and a matching portion 132. As will be described later, at least one side surface, out of the rectangular-parallelepiped-shaped side surfaces of the main body portion 131, forms an opened surface 15. The other surfaces of the main body portion 131 than the surface on which a diaphragm holding member 155 is installed, out of the rectangular-parallelepiped-shaped side surfaces thereof, may either be constituted by walls of the second casing 121 or be constituted by side walls of the first casing 7 in the state where the second casing 121 is incorporated in the first casing 7 such that the second casing 121 itself has no wall. The second casing 121 is secured, in position, to a side surface or an inner surface of the first casing 7 or to the charged particle optical barrel. The main body portion 131 has the function of housing a sample 6 to be observed and is inserted into the first casing 7 through the aforementioned opening portion. The matching portion 132 forms a surface to be matched with the outer wall surface in the side surface of the first casing 7 which is provided with the opening portion and, further, is secured to the outer wall surface in the aforementioned side surface, with a vacuum sealing member 126 interposed therebetween. Thus, the second casing 121 is entirely fitted to the first casing 7. The aforementioned opening portion can be fabricated most easily by using an opening for introducing and extracting samples therethrough, which has been originally provided in the vacuum sample chamber in the charged particle microscope. Namely, by fabricating the second casing 121 in conformance to the size of the hole which has been originally formed and by mounting the vacuum sealing member 126 around the hole, it is possible to necessitate only minimum necessary modification of the device. Further, the second casing 121 can be detached from the first casing 7.

A side surface of the second casing 121 is the opened surface 15 which communicates with an atmospheric-air space with a plane with a size which is at least capable of introducing and extracting samples therethrough. A sample 6 housed in the inside (the right side with respect to a dotted line in the figure; hereinafter, referred to as a second space) of the second casing 121 is placed in an atmospheric pressure state during observations. Further, FIG. 10 illustrates only the single opened surface 15, since the figures are cross-sectional views of the device in a direction parallel with the optical axis. When t is vacuum-sealed by the side surfaces of the first casing in the direction getting farther away from the person viewing the paper plane of FIG. 10 and in the direction toward this person, the opened surface 15 in the second casing 121 is not limited to the single surface. It is necessary that there is at least a single opened surface in the state where the second casing 121 is incorporated in the first casing 7. On the other hand, a vacuum pump 4 is connected to the first casing 7, which enables evacuating the closed space (hereinafter, referred to as a first space) formed by the inner wall surfaces of the first casing 7, the outer wall surfaces of the second casing and the diaphragm 10. By placing the diaphragm in such a way as to maintain the pressure in the second space higher than the pressure in the first space, it is possible to isolate the second space in pressure, in the present example. Namely, while the first space 11 is maintained at a higher vacuum by the diaphragm 10, the second space 12 is maintained under a gas ambience at the atmospheric pressure or at substantially the same pressure as the atmospheric pressure. Therefore, during operations of the device, it is possible to maintain the charged particle optical barrel 2 and the detector 3 at a vacuum state and, also, it is possible to maintain the sample 6 under the atmospheric pressure. Further, since the second casing 121 has the opened surface, it is possible to arbitrarily exchange the sample 6 during observations.

On the upper surface of the second casing 121, there is provided the diaphragm 10 at a position just beneath the charged particle optical barrel 2, when the second casing 121 is entirely fitted to the first casing 7. The diaphragm 10 is capable of transmitting or passing, therethrough, the primary charged particle beam emitted from the lower end of the charged particle optical barrel 2, and the primary charged particle beam passes through the diaphragm 10 and finally reaches the sample 6.

The sample stage 5 and the like are placed inside the second casing 121, which enables arbitrarily moving the sample 6.

The present device includes a filter 200 for protecting the inside of the charged particle optical barrel from contaminations, similarly to in Example 1. Similarly to in Example 1, the filter 200 is provided between the thin film 10 and the detector 3. In the present structure, it is preferable that the filter 200 is installed at a position on the diaphragm holding member 155 in view of the maintainability, similarly to in Example 1. However, it can be also placed on the second casing 121, the casing 7, the detector 3 or the charged particle optical barrel 2. The structures regarding the filter are similar to those in Example 1 and, therefore, are not described in detail.

Example 3

Figure 11:
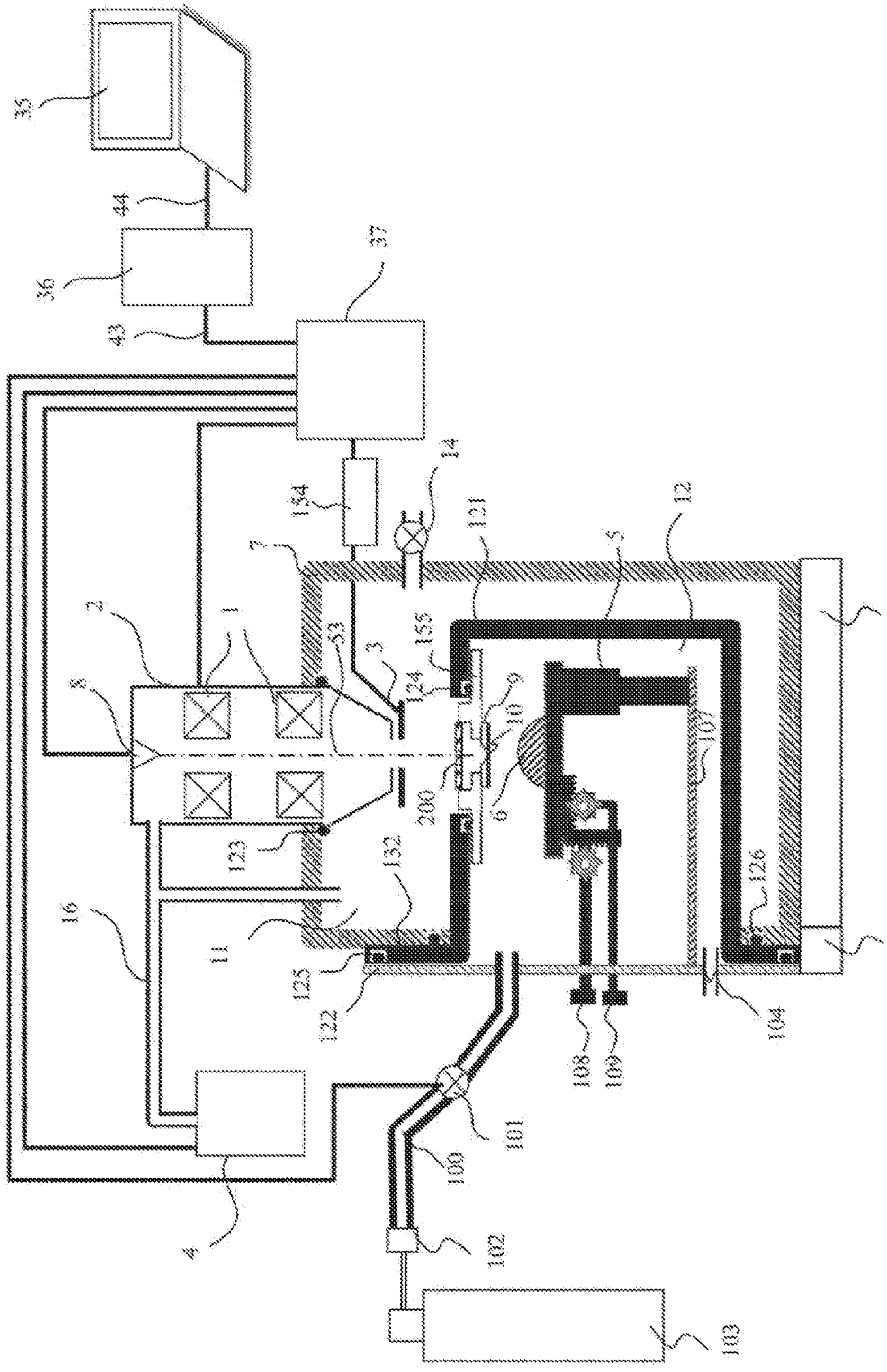
FIG. 11 is a view of the entire structure of a charged particle microscope in Example 3.

FIG. 11 illustrates a view of the entire structure of a charged particle microscope in the present example. Similarly to in Examples 1 and 2, the charged particle microscope in the present example is constituted by a charged particle optical barrel 2, a first casing (vacuum chamber) 7 for supporting the charged particle optical barrel with respect to a device installation surface, a second casing (attachment) 121 which is used by being inserted into the first casing 7, and a control system, and the like. Operations and functions of these respective components, and additional components provided in addition to these respective components are substantially the same as those in Examples 1 and 2 and, therefore, will not be described in detail.

In the case of the charged particle optical barrel in the present example, an opened surface, which forms at least a single side surface of the second casing 121, can be covered with a lid member 122, thereby realizing various functions. Hereinafter, this will be described.

(Regarding a Sample Stage)

In the charged particle microscope in the present example, the lid member 122 is provided with the sample stage 5 as a means for changing the position of the sample for moving the field of view for observations. The sample stage 5 includes an XY-driving mechanism for in-plane directions, and a Z-axis driving mechanism for a heightwise direction. A supporting plate 107, which forms a bottom plate for supporting the sample stage 5, is mounted to the lid member 122, and the sample stage 5 is secured to the supporting plate 107. The supporting plate 107 is mounted thereto, in such a way as to stretch toward the inside of the second casing 121, in such a way as to face the surface of the lid member 122 which is faced to the second casing 121. Respective supporting shafts are extended from the Z-axis driving mechanism and the XY-driving mechanism and are connected to a manipulation knob 108 and a manipulation knob 109 included in the lid member 122, respectively. The user of the device can manipulate these manipulation knobs 108 and 109 for adjusting the position of the sample 6 within the second casing 121.

(Regarding the Ambience Around the Sample)

The charged particle microscope in the present example includes a function of supplying a replacement gas to the inside of the second casing or a function of creating a different air-pressure state from that in the first space 11 and that of external air outside the device. A charged particle beam emitted from the lower end of the charged particle optical barrel 2 passes through the first space maintained at a higher vacuum and passes through the diaphragm 10, so that the charged particle beam is directed to the sample 6. In an atmospheric-air space, an electron beam is scattered by gas molecules, thereby shortening the mean free path. Namely, when there is a large distance between the diaphragm 10 and the sample 6, the primary charged particle beam, or the secondary electrons, reflected electrons, transmitted electrons or the like which are generated by the irradiation of the charged particle beam cannot reach the sample and the detector 3. On the other hand, the probability of scattering of the charged particle beam is proportional to the mass number and the density of the gas molecules. Accordingly, by performing replacement of the second space with gas molecules with a smaller mass number than that of the atmospheric air or by performing slight evacuation thereon, it is possible to reduce the probability of scattering of the electron beam, thereby enabling the charged particle beam to reach the sample. Further, it is necessary to perform evacuation or replacement of the atmospheric air with gas, only at least in the path of travel of the charged particle beam in the second space, namely in the space between the diaphragm 10 and the sample 6, rather than in the entire second space.

For the aforementioned reason, in the charged particle microscope in the present example, the lid member 122 is provided with a portion for mounting a gas supply pipe 100 (a gas introducing portion) thereto. The gas supply pipe 100 is coupled to a gas bomb 103 through a coupling portion 102, which enables introducing a replacement gas into the second space 12. Halfway through the gas supply pipe 100, there is placed a gas control valve 101 thereon, which enables controlling the flow rate of the replacement gas flowing through the pipe. Therefore, a signal line extends from the gas control valve 101 to a lower-order control portion 37, and the device user can control the flow rate of the replacement gas through a manipulation screen displayed on the monitor in a computer 35. Further, the gas control valve 101 can be opened and closed by being manually manipulated.

Regarding the type of the replacement gas, any gasses lighter than the atmospheric air, such as nitrogen and water vapor, can be used for providing an effect of improving the image S/N ratio, but helium gas and hydrogen gas which have further smaller masses can provide a larger effect of improving the image S/N ratio.

The replacement gas is such a light-element gas and, therefore, tends to accumulate in an upper portion of the second space 12, which makes it harder to perform replacement in a lower side thereof. Therefore, the lid member 122 is provided with an opening for communicating the inside of the second space with the outside, below the position at which the gas supply pipe 100 is mounted thereto. For example, in FIG. 11, the opening is provided at the position where a pressure adjustment valve 104 is mounted thereto. This causes the atmospheric-air gas to be discharged through the lower opening by being pushed by the light-element gas introduced through the gas introducing portion, which enables efficiently performing gas replacement of the inside of the second casing 121. Further, this opening can be also used as a rough-exhaust port, which will be described later.

Instead of the aforementioned opening, the pressure adjustment valve 104 can be provided. This pressure adjustment valve 104 has a function of automatically opening the valve if the internal pressure in the second casing 121 becomes equal to or more than 1 atm. By providing the pressure adjustment valve having this function, it is possible to fill the inside of the device with the light-element gas, since, if the internal pressure becomes equal to or more than 1 atm, during introduction of the light-element gas, the pressure adjustment valve is automatically opened to exhaust atmospheric-air gas components, such as nitrogen and oxygen, to the outside of the device. Further, the gas bomb or the vacuum pump 103 illustrated in the figure may be provided in the charged particle microscope or may be retrofitted thereto by the device user.

Further, even a light-element gas such as helium gas or hydrogen gas may induce larger scattering of electron beams. In this case, the gas bomb 103 can be replaced with a vacuum pump. Further, by performing slight evacuation therewith, it is possible to bring the inside of the second casing into an extreme vacuum state (namely, into an ambience at a pressure closer to the atmospheric pressure). Namely, it is possible to produce a vacuum in the space between the diaphragm 10 and the sample 6. For example, the second casing 121 or the lid member 122 can be provided with a vacuum evacuation port, and the inside of the second casing 121 can be slightly evacuated therethrough. Thereafter, a replacement gas can be introduced thereinto. In this case, for attaining such evacuation, it is necessary only to reduce atmospheric-air gas components remaining within the second casing 121 to a certain amount or less and, therefore, it is not necessary to perform high evacuation, and it is possible to perform rough evacuation for sufficiently attaining it.

As described above, in the present example, the space in which the sample is placed can be controlled to an arbitrary degree of vacuum in the range of an atmospheric pressure (about $10^5$Pa) to about $10^3$Pa. With conventional so-called low-vacuum scanning electron microscopes, an electron beam column is communicated with a sample chamber and, therefore, if the degree of vacuum in the sample chamber is lowered to create a pressure closer to the atmospheric pressure therein, this changes the pressure in the electron beam column together therewith. This has made it hard to control the sample chamber to a pressure in the range of the atmospheric pressure (about $10^5$Pa) to $10^3$ Pa. In the present example, the second space and the first space are isolated from each other by the thin film, which enables arbitrarily controlling the type of the gas and the pressure of the ambience in the second space 12 which is surrounded by the second casing 121 and the lid member 122. This enables controlling the sample chamber to a pressure in the range of the atmospheric pressure (about $10^5$ Pa) to $10^3$ Pa, although it has been conventionally difficult to control it to this pressure range. Further, this enables performing observations of sample states by continuously changing the pressure around the atmospheric pressure, as well as observations under the atmospheric pressure (about $10^5$Pa).

Further, although not illustrated, the bomb 103 portion can be also formed to be a composite gas control unit constituted by a gas bomb and a vacuum pump which are compositely connected to each other, and the like.

The structure in the present example has the characteristic that the second space 12 inside the second casing is closed, in comparison with the aforementioned structures. This can provide a charged particle beam device capable of introducing gas between the diaphragm 10 and the sample 6 and or evacuating it.

(Others)

As described above, in the present example, the sample stage 5, the manipulation knobs 108 and 109 therefor, the gas supply pipe 100, and the pressure adjustment valve 104 are all collectively mounted to the lid member 122. This enables the device user to perform manipulations of the aforementioned manipulation knobs 108 and 109, operations for exchanging the sample, and manipulations of the gas supply pipe 100 and the pressure adjustment valve 104, through the same surface of the first casing. This can significantly improve the manipulability, in comparison with charged particle microscopes structured to have the aforementioned constituents mounted dispersedly to other surfaces of the sample chamber.

In addition to the aforementioned structures, it is possible to provide a contact monitor for detecting the state of contact between the second casing 121 and the lid member 122, in order to monitor the second space being closed or opened.

Further, in addition to the secondary electron detector and the reflected electron detector, it is possible to provide an X-ray detector and a photo detector, in order to enable EDS analyses and fluorescent ray detections. Regarding the placement of the X-ray detector and the photo detector, they can be placed in any of the first space 11 and the second space 12.

The device in the present example includes a filter 200 for protecting the inside of the charged particle optical barrel from contaminations, similarly to in Examples 1 and 2. Similarly to in Examples 1 and 2, there is provided the filter 200 between the thin film 10 and the detector 3. In the present structure, it is preferable that the filter 200 is installed at a position on the diaphragm holding member 155, in view of the maintainability, similarly to in Examples 1 and 2. However, it can be also placed on the second casing 121, the casing 7, the detector 3 or the charged particle optical barrel 2. The structures regarding the filter are the same as those of Examples 1 and 2 and, therefore, are not described in detail.

As described above, in the present example, it is possible to introduce a replacement gas from the atmospheric pressure, in addition to the effects of Examples 1 and 2. Further, it is possible to observe a sample under an ambience at a different pressure from that of the first space. Further, by removing the diaphragm for communicating the first space and the second space with each other, it is possible to realize a SEM capable of observations of samples in the same vacuum state as that in the first space, as well as observations under an atmospheric-air ambience or a predetermined gas ambience.

Example 4

Figure 12C:
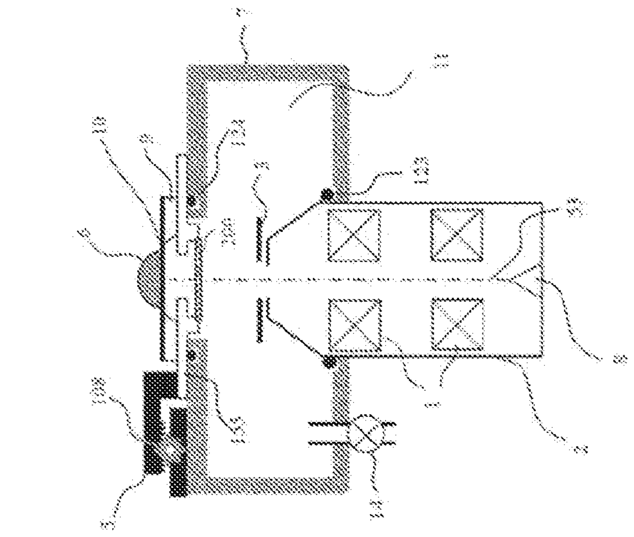
FIGS. 12A-12C are views of the entire structure of a charged particle microscope in Example 4.
Figure 12B:
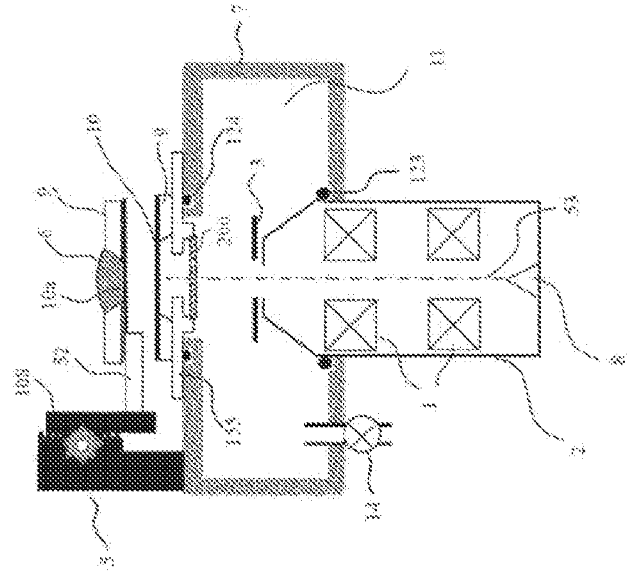
Figure 12A:
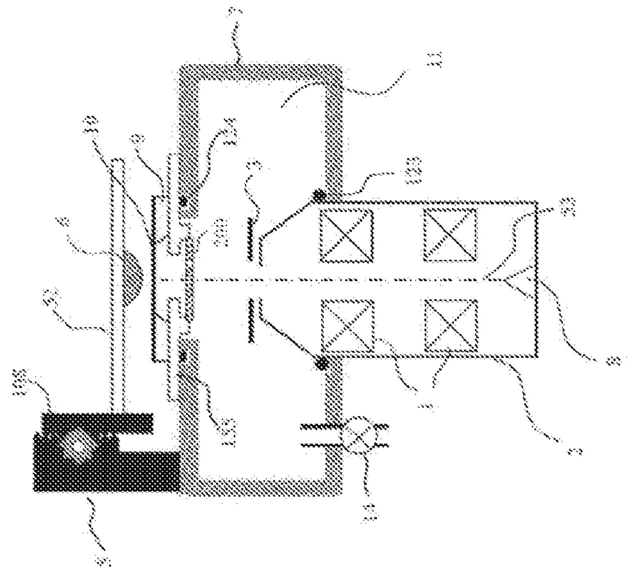

In the present example, there will be described structures each having a charged particle optical barrel 2 existing under a diaphragm 10, as examples of modifications of Example 1. FIG. 12(*a*) illustrates a view of the structure of a charged particle microscope in the present example. In the figure, a vacuum pump, a control system and the like therein are not illustrated. Further, it is assumed that a casing 7 as a vacuum chamber, and the charged particle optical barrel 2 are supported by columns, supporters and the like on a device installation surface. Operations and functions of these respective components, and additional components provided in addition to these respective components are substantially the same as those in the aforementioned examples and, therefore, will not be described in detail.

There is provided a sample stage 5 placed under an atmospheric-air ambience. A sample 6 is secured or dropped to a sample table 52, and the sample table 52 is secured to the sample stage 5. The sample stage 5 includes a Z-axis driving mechanism having a height adjustment function capable of bringing at least the sample 6 closer to the diaphragm 10. As a matter of course, it can also include an XY driving mechanism which is movable in sample in-plane directions. The respective driving mechanisms can be arbitrarily operated through a manipulation knob 108 and the like.

The present structure includes a filter 200, just beneath a thin-film holding member 155, namely between the thin film 10 and the detector 3. The structures regarding the filter are similar to those in Examples 1 to 3 and, therefore, will not be described in detail.

FIG. 12(*b*) illustrates an example of a structure employing a diaphragm 10*a* for holding a sample. The sample 6 is held on the diaphragm 10*a*, and the diaphragm 10*a* is secured to the sample table 52 with a pedestal 9 portion interposed therebetween. The present structure enables observations while preventing the sample 6 from falling therefrom.

As in an example of a structure illustrated in FIG. 12(*c*), the sample 6 may be placed on the diaphragm 10. With the present structure, the sample 6 is brought into contact with the diaphragm 10 beforehand, which eliminates the necessity of manipulations for bringing the sample 6 closer to the diaphragm 10, thereby resulting in preferable maneuverability.

Further, the present invention is not intended to be limited to the aforementioned examples and is intended to embrace various examples of modifications. For example, the aforementioned examples have been described in detail, in order to explain the present invention such that it can be easily understood, and the present invention is not intended to necessarily include all the described structures. Further, the structure in a certain example can be replaced, at a portion thereof, with the structure in another example. Also, in addition to the structure in a certain example, it is possible to provide the structure in another example. Further, for a portion of the structure in each of Examples, it is also possible to perform addition, elimination or substitution of other structures. Further, the aforementioned respective structures, functions, processing portions, processing means and the like can be partially or entirely realized by hardware by being designed as integrated circuits, and the like, for example. Further, the aforementioned respective structures, functions and the like can be realized by software, such that processors interpret and execute programs for realizing their respective functions.

Information about programs, tables, files and the like for realizing the respective functions can be incorporated in storage devices such as memories, hard disks and Solid State Drives (SSDs), or in recording mediums such as IC cards, SD cards, optical disks.

Further, there are illustrated only the control lines and the information lines which are considered to be necessary for description, and all the control lines and the information lines in the products are not necessarily illustrated. In actual, it can be considered that almost all the structures are interconnected.

REFERENCE SIGNS LIST

1: Optical lens, 2: Charged particle optical barrel, 3: Detector, 4: Vacuum pump, 5: Sample stage, 6: Sample, 7: Casing, 8: Charged particle source, 9: Pedestal, 10: Diaphragm, 11: First space, 12: Second space, 14: Leak valve, 15: Opened surface, 16: Vacuum pipe, 17: Stage support table, 18: Supporting column, 19: Lid member supporting member, 20: Bottom plate, 35: Computer, 36: Higher-order control portion, 37: Lower-order control portion, 43, 44 and 45: Communication line, 52: Sample table, 53: Optical axis of charged particle beams, 100: Gas supply pipe, 101: Gas control valve, 102: Coupling portion, 103: Gas bomb and Vacuum pump, 104: Pressure adjustment valve, 107: Supporting plate, 108 and 109: Manipulation knob, 121: Second casing, 122: Lid member, 123, 124, 125, 126, 128 and 129: Vacuum sealing member, 130: Lid member, 131: Main body portion, 132: Matching portion, 154: Signal amplifier, 155: Diaphragm holding member, 155*a*: Position-setting portion, 200: Filter, 201 and 202: hole, 203: Air vent hole, 204: Member, 205: Filter holding member, 205*a*: Beam, 205*b*: Hole, 210: Thin film, 210*a*: Pedestal, 210*b*: Reinforcement member, 250: Thin film filter, 250*a*: Filter holding member, 251: Mesh filter, 251*a*: Filter holding member, 252: Supporting member, 252*a*: Handle

The invention claimed is:

1. A charged particle beam device comprising:

a charged particle optical barrel for directing a primary charged particle beam to a sample;

a casing which is adapted to form a portion of the charged particle beam device and to be interiorly evacuated by a vacuum pump, the sample being mounted outside the casing;

a diaphragm which is capable of maintaining a space to be subjected to the evacuation at an airtight state and also is adapted to transmit or pass the primary charged particle beam therethrough; and a filter member which is placed on a path of the primary charged particle beam at least in a state where the primary charged particle beam is directed to the sample, is installed on a diaphragm holding member, adapted to hold the diaphragm, so as to be attached to both the filter member and the diaphragm, and, further, is adapted to transmit or pass, therethrough, the primary charged particle beam and a secondary charged particle derived from the sample, while intercepting at least a portion of a scattering substance which is scattered in the event of a fracture of the diaphragm;

wherein the diaphragm holding member has a position-setting portion for setting a position of the filter member with respect to the diaphragm.

2. The charged particle beam device according to claim 1, wherein the filter member has an opening for transmitting or passing, therethrough, the primary charged particle beam and the secondary charged particle.

3. The charged particle beam device according to claim 2, wherein the opening for transmitting or passing the primary charged particle beam therethrough is on an optical axis of the charged particle optical barrel.

4. The charged particle beam device according to claim 2, wherein the filter member has two or more openings for transmitting or passing the secondary charged particle therethrough.

5. The charged particle beam device according to claim 1, wherein at least a portion of the filter member is a mesh member.

6. The charged particle beam device according to claim 1, wherein the filter member is detachably installed on the diaphragm holding member.

7. The charged particle beam device according to claim 1, wherein the filter member has an opening portion for transmitting or passing the primary charged particle beam therethrough, and a thin film portion for transmitting or passing the secondary charged particle beam therethrough.

8. The charged particle beam device according to claim 7, wherein the thin film portion has a reinforcement member for reinforcing the thin film, on its surface.

9. The charged particle beam device according to claim 1, wherein the filter member is one of a plurality of filter members placed in series on an optical axis of the charged particle optical barrel.

10. The charged particle beam device according to claim 2, further comprising a hole, different from the opening, adapted to communicate a space between the filter member and the diaphragm with a space within the casing, and to discharge at least a portion of gas flowing into the charged particle optical barrel through the diaphragm, to an inside of the casing, upon a fracture of the diaphragm.

11. A filter member installed in a charged particle beam device, the charged particle beam device comprising:

a charged particle optical barrel for directing a primary charged particle beam to a sample;

a casing which is adapted to form a portion of the charged particle beam device and to be interiorly evacuated by a vacuum pump, the sample being mounted outside the casing; and a diaphragm which is capable of maintaining a space to be subjected to the evacuation at an airtight state and also is adapted to transmit or pass the primary charged particle beam therethrough;

wherein the filter member is placed on a path of the primary charged particle beam at least in a state where the primary charged particle beam is directed to the sample, is installed on a diaphragm holding member, adapted to hold the diaphragm, so as to be attached to both the filter member and the diaphragm, and, further, is adapted to transmit or pass, therethrough, the primary charged particle beam and a secondary charged particle discharged from or reflected by the sample, while intercepting at least a portion of a scattering substance which is scattered in the event of a fracture of the diaphragm; and wherein the diaphragm holding member has a position-setting portion for setting a position of the filter member with respect to the diaphragm.

* * * * *